United States Patent
Chang

(10) Patent No.: US 10,503,085 B2
(45) Date of Patent: Dec. 10, 2019

(54) LITHOGRAPHY APPARATUS AND METHOD

(71) Applicant: Taiwan Semiconductor Manufacturing Co., Ltd., Hsinchu (TW)

(72) Inventor: Shih-Ming Chang, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/007,182

(22) Filed: Jun. 13, 2018

(65) Prior Publication Data

US 2019/0146361 A1 May 16, 2019

Related U.S. Application Data

(60) Provisional application No. 62/586,948, filed on Nov. 16, 2017.

(51) Int. Cl.
G03F 7/20 (2006.01)

(52) U.S. Cl.
CPC ...... *G03F 7/70875* (2013.01); *G03F 7/70341* (2013.01); *G03F 7/70891* (2013.01)

(58) Field of Classification Search
CPC ............. G03F 7/70341; G03F 7/70875; G03F 7/70891
USPC .............................................. 355/30, 72, 77
See application file for complete search history.

(56) References Cited

U.S. PATENT DOCUMENTS

| | | | | |
|---|---|---|---|---|
| 6,970,228 B1* | 11/2005 | Aoki | .................... | G03F 7/70225 355/30 |
| 2002/0057423 A1* | 5/2002 | Nogawa | .............. | G03F 7/70866 355/30 |
| 2005/0007569 A1* | 1/2005 | Streefkerk | .......... | G03F 7/70341 355/30 |
| 2006/0033892 A1* | 2/2006 | Cadee | ................. | G03F 7/70341 355/30 |
| 2006/0215137 A1* | 9/2006 | Hasegawa | ........... | G03F 7/70916 355/53 |
| 2008/0003521 A1* | 1/2008 | Elian | ...................... | G03F 7/2041 430/270.1 |
| 2009/0122283 A1* | 5/2009 | Hasegawa | ........... | G03F 7/70341 355/53 |
| 2012/0229783 A1* | 9/2012 | Nienhuys | ............ | G03F 7/70891 355/30 |
| 2018/0173116 A1* | 6/2018 | Koevoets | ............ | G03F 7/70783 |

* cited by examiner

*Primary Examiner* — Colin W Kreutzer
(74) *Attorney, Agent, or Firm* — Birch, Stewart, Kolasch & Birch, LLP

(57) ABSTRACT

A lithography apparatus is provided. The lithography apparatus includes an exposure system and a fluid handling system. The exposure system is configured to expose an exposure area on a substrate with an energy flow. The fluid handling system is configured to provide a heat transfer fluid flowing through a non-exposure area other than the exposure area on the substrate, to take heat away from the substrate.

20 Claims, 7 Drawing Sheets

LITHOGRAPHY APPARATUS AND METHOD

CROSS REFERENCE TO RELATED APPLICATIONS

The present application claims priority of U.S. Provisional Patent Application No. 62/586,948, filed on Nov. 16, 2017, the entirety of which is incorporated by reference herein.

BACKGROUND

A photolithography or lithography apparatus is a machine that applies a desired pattern onto a semiconductor substrate, usually onto a target portion of the substrate. A lithography apparatus can be used, for example, in the manufacture of integrated circuits (ICs). In that instance, a patterning member, such as a mask or a reticle, may be used to generate a circuit pattern to be formed on an individual layer of the IC. The circuit pattern can be transferred onto a target portion (e.g. comprising one or more dies) on a substrate (e.g. a silicon wafer). Transfer of the pattern is typically achieved via imaging onto a layer of radiation-sensitive material (i.e. photoresist) provided on the substrate.

In general, a single substrate contains a network of adjacent target portions that are patterned successively. Known lithography apparatuses include so-called steppers, in which each target portion is irradiated by exposing an entire pattern onto the target portion at one time, and so-called scanners, in which each target portion is irradiated by scanning the pattern through a radiation beam in a given scanning direction while synchronously scanning the substrate parallel or anti-parallel in this direction.

Although existing lithography apparatuses and methods have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
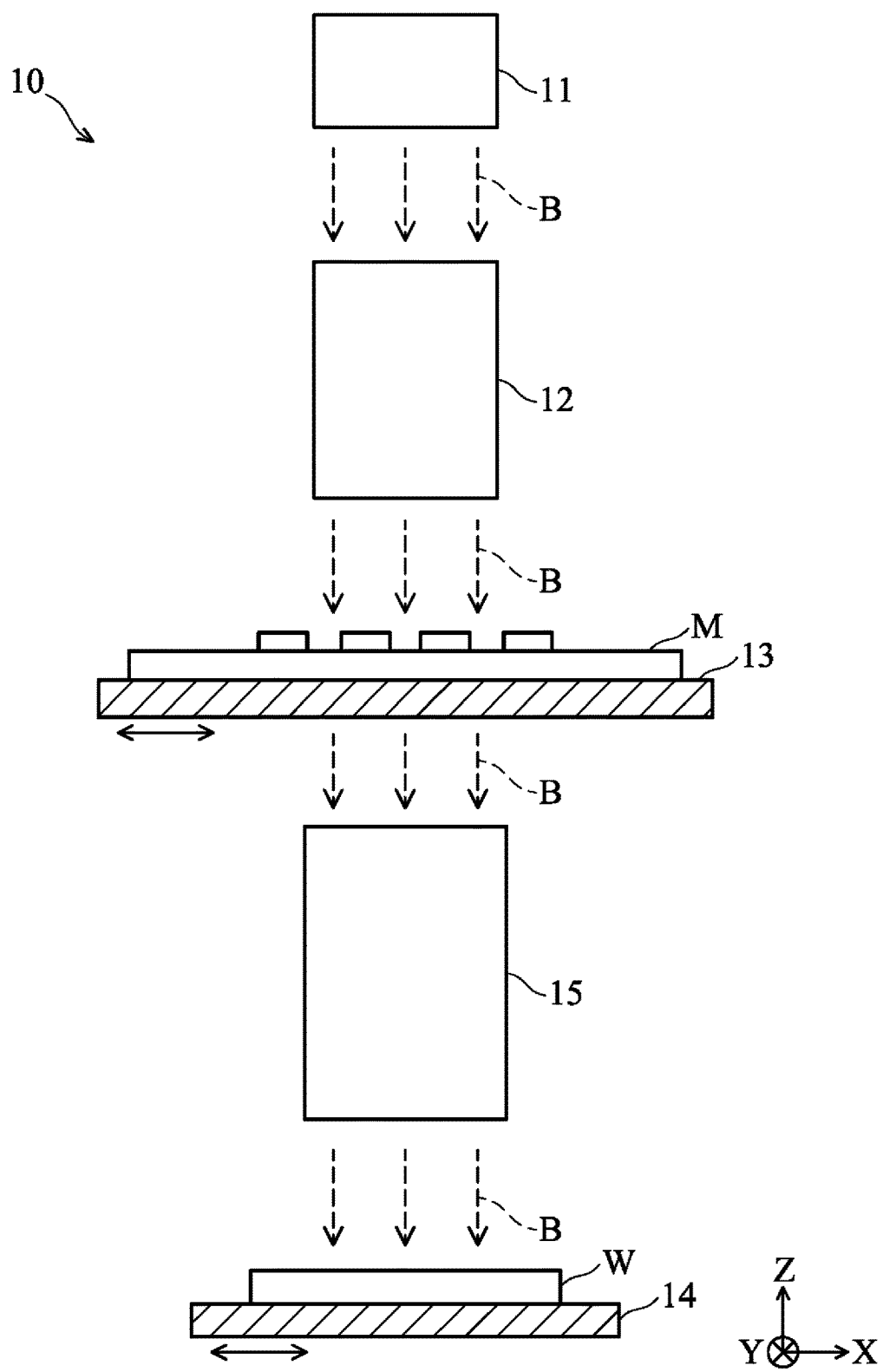
FIG. 1 is a schematic diagram of a lithography apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, lithography apparatuses for carrying out a lithography process are provided in accordance with various exemplary embodiments. The variations of some embodiments are discussed. Throughout the various views and illustrative embodiments, like reference numbers are used to designate like elements.

FIG. 1 is a schematic diagram of a lithography apparatus 10 in accordance with some embodiments. The lithography apparatus 10 includes a light source 11, an illumination system 12, a mask stage 13, a substrate stage 14, and a projection system 15. It should be noted that the lithography apparatus 10 in FIG. 1 has been simplified for the sake of clarity to better understand the inventive concepts of the present disclosure. Additional features can be added into the lithography apparatus 10, and some of the features described below can be replaced or eliminated in other embodiments of the lithography apparatus 10.

The light source 11 is configured to generate a radiation beam B. In some embodiments, the radiation beam B has a wavelength of at least 5 nm, e.g., at least 13.5 nm, at least 193 nm, at least 248 nm, or at least 365 nm. In some embodiments, the radiation beam B has a wavelength of at most 450 nm, e.g., at most 365 nm, at most 248 nm, at most 193 nm, or at most 14 nm. In some embodiments, the radiation beam B includes a broad band of wavelengths, for example encompassing 365, 405, and 436 nm. In some embodiments, the light source 11 comprises a mercury lamp, an ultraviolet (UV) lamp, an excimer laser or the like. In some embodiments, the light source 11 includes a light source chamber in which UV radiation, such as deep ultraviolet (DUV) radiation (with wavelength of about 193 nm)

and/or extreme ultraviolet (EUV) radiation (with wavelength from about 1 nm to about 100 nm), is generated from plasma.

The illumination system 12 is configured to condition the radiation beam B form the light source 11. In some embodiments, the illumination system 12 includes various types of optical components, such as refractive, reflective, magnetic, electromagnetic, electrostatic or other types of optical components, or any combination thereof, for directing, sharping, or controlling the radiation beam B. In some embodiments, the illumination system 12 includes an adjuster for adjusting the angular intensity distribution of the radiation beam B. Moreover, the illumination system 12 may include various other optical components, such as an integrator and a condenser, so as to condition radiation beam B to have a desired uniformity and intensity distribution in its cross-section.

The mask stage 13 is configured to hold a patterning member M. In some embodiments, the mask stage 13 holds the patterning member M in a manner that depends on the orientation of the patterning member M, the design of the lithography apparatus 10, and other conditions, for example, whether or not the patterning member M is held in a vacuum environment. In some embodiments, the mask stage 13 uses mechanical, vacuum, electrostatic, or other clamping techniques to hold the patterning member M. In some embodiments, the mask stage 13 is fixed or movable as required. In some embodiments, the mask stage 13 is configured to ensure that the patterning member M is at a desired position, for example, with respect to the projection system 15.

Figure 2:
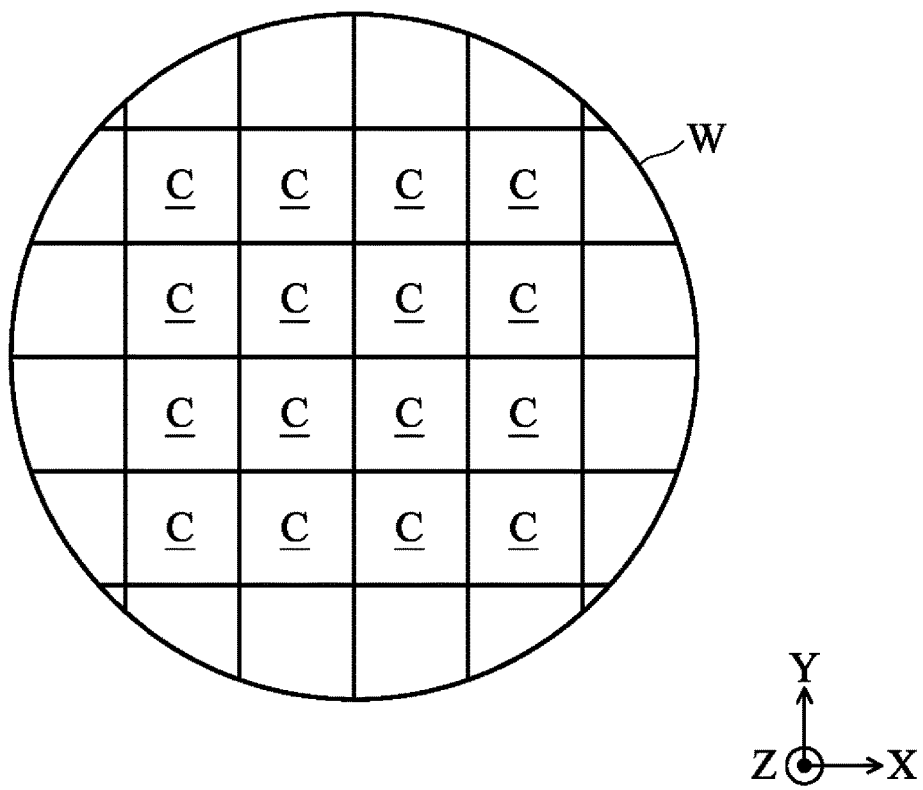
FIG. 2 schematically illustrates a wafer having several target portions in accordance with some embodiments.

The patterning member M is configured to impart the radiation beam B from the illumination system 12 with a pattern in its cross-section, so as to create a pattern in a target portion C (e.g. comprising one or more dies) of a substrate W (see also FIG. 2). In some embodiments, the pattern imparted to the radiation beam B will correspond to a particular functional layer in a device being created in the target portion C, such as an integrated circuit. In some embodiments, the patterning member M is of a transmissive type or a reflective type. In some embodiments, the patterning member M comprises a mask/reticle, a programmable mirror array, or a programmable LCD panel, or a stencil structure. In some embodiments, a mask comprises mask types such as binary, alternating phase-shift, and attenuated phase-shift, as well as various hybrid mask types. In some embodiments, a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

It should also be understood that not only the radiation beam can be used for lithography, Charged Particle Lithography, such as Electron Beam Direct Writing (EBDW), can also be used for patterning. For an EBDW lithography apparatus/system, a light source 11 is replaced by an electron source that can generate a focused beam of electrons, and no patterning member M is needed.

The substrate stage 14 is configured to hold a substrate W (e.g. a photoresist-coated wafer or the like). In some embodiments, the substrate stage 14 holds the substrate W in a manner that depends on the orientation of the substrate W, the design of the lithography apparatus 10, and other conditions, for example, whether or not the substrate W is held in a vacuum environment. In some embodiments, the substrate stage 14 uses mechanical, vacuum, electrostatic, or other clamping techniques to hold the substrate W. In some embodiments, the substrate stage 14 is fixed or movable as required. In some embodiments, the substrate stage 14 is configured to ensure that the substrate W is at a desired position, for example, with respect to the projection system 15.

In some embodiments, with the aid of a position sensor (e.g. an interferometric device, linear encoder or capacitive sensor (not shown)), the substrate stage 14 can be moved accurately, so as to position different target portion C of the substrate W in the path of the radiation beam B. Similarly, with the aid of another position sensor, the mask stage 13 can be used to accurately position the patterning member M with respect to the path of the radiation beam B, e.g. during a scan which will be described below. In some embodiments, a controller (not shown) which is electrically connected to the position sensors can be used to control the motion of the substrate stage 14 and the mask stage 13.

The projection system 15 is configured to project a pattern imparted to the radiation beam B by the patterning member M onto a target portion C of the substrate W. In some embodiments, the projection system 15 comprises any type of projection system, including refractive, reflective, catadioptric, magnetic, electromagnetic and electrostatic optical systems, or any combination thereof, as appropriate for the exposure radiation being used.

In some embodiments, if EUV radiation beam B is used to expose the substrate W, all the above optical systems/components of the lithography apparatus 10, the (reflective) patterning member M and the substrate W will need to be placed in a vacuum chamber (not shown) because that EUV radiation beam B is absorbed very strongly in most materials, including air.

The depicted lithography apparatus 10 could be used in at least one of the following modes:

In step mode, the mask stage 13 and the substrate stage 14 are kept essentially stationary, while an entire pattern imparted to the radiation beam B is projected onto a target portion C at one time (i.e. a single static exposure). The substrate stage 14 is then shifted in the X and/or Y direction so that a different target portion C can be exposed. In step mode, the maximum size of the exposure field limits the size of the target portion C imaged in a single static exposure.

In scan mode, the mask stage 13 and the substrate stage 14 are scanned synchronously while a pattern imparted to the radiation beam B is projected onto a target portion C (i.e. a single dynamic exposure). The velocity and direction of the substrate stage 14 relative to the mask stage 13 may be determined by the (de-)magnification and reversal characteristics of the projection system 15. In scan mode, the maximum size of the exposure field limits the width (in the non-scanning direction) of the target portion C in a single dynamic exposure, whereas the length of the scanning motion determines the height (in the scanning direction) of the target portion C.

In another mode, the mask stage 13 is kept essentially stationary holding a programmable patterning member M, and the substrate stage 14 is moved or scanned while a pattern imparted to the radiation beam B is projected onto a target portion C. In this mode, a pulsed radiation source is generally employed and the programmable patterning member M is updated as required after each movement of the substrate stage 14 or in between successive radiation pulses during a scan. This mode of operation can be readily applied to mask-less lithography that utilizes a programmable patterning member M, such as a programmable mirror array of the type described above.

Combinations and/or variations on the modes of use described above or entirely different modes of use may alternatively be employed.

It should be understood that the temperature control of the substrate W during the exposure (i.e. while the exposure system of the lithography apparatus 10 described above exposes the target portions C of the substrate W) is related to the lithography process yield. Embodiments of the lithography apparatus 10 therefore further use a fluid handling system 20 as described below to maintain the temperature of the substrate W during the exposure, so as to avoid a critical dimension (CD) error (due to an undesired chemical reaction of the photoresist coated on the substrate W) or/and an overlay error (due to the thermal expansion or bending of the substrate W) occurring in the lithography process (i.e. improving the lithography process yield). The fluid handling system 20 is configured to provide a heat transfer fluid 30 onto the substrate W during the exposure, to take heat away from the substrate W.

Figure 3:
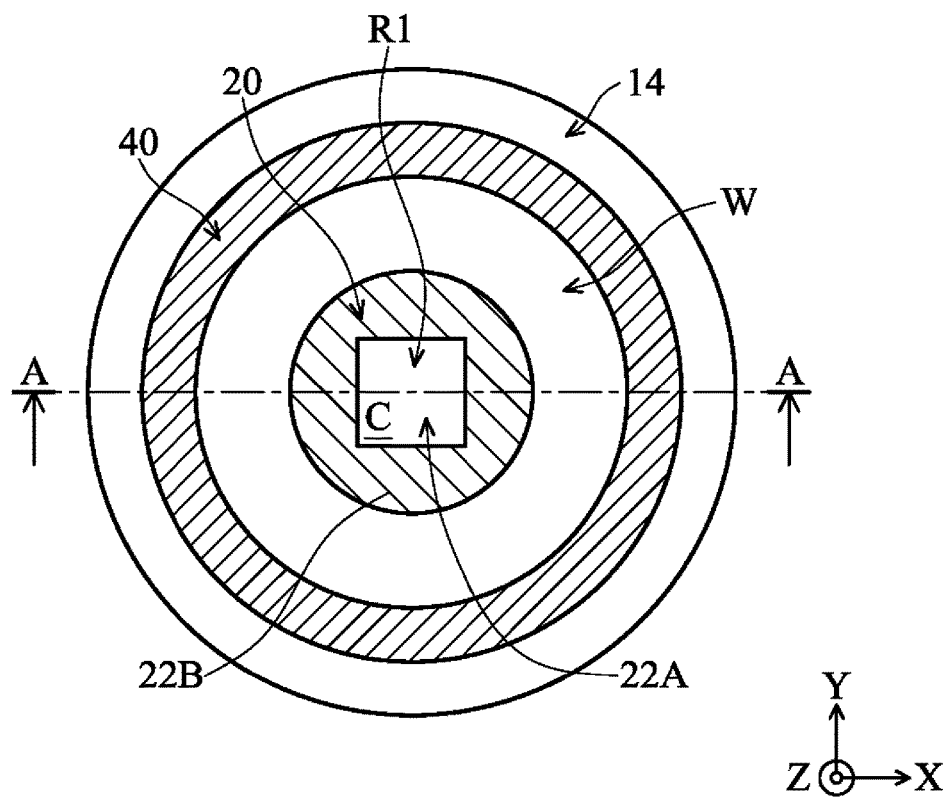
FIG. 3 schematically illustrates the arrangement of a fluid handling system, the substrate and the substrate stage in accordance with some embodiments.
Figure 4:
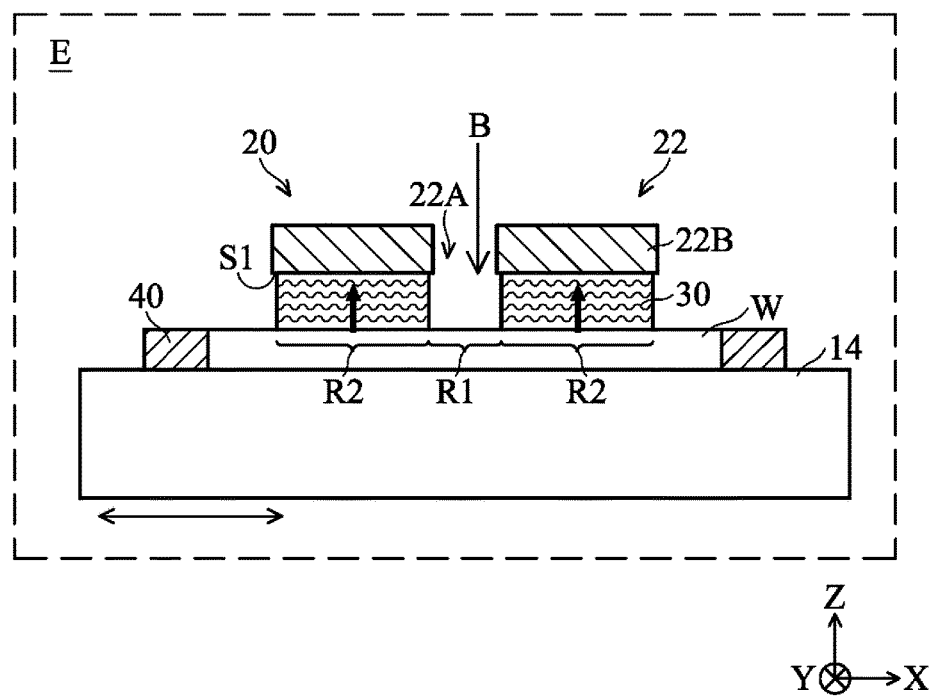
FIG. 4 is a cross-sectional view taken along the line A-A in FIG. 3.

FIG. 3 schematically illustrates the arrangement of the fluid handling system 20, the substrate W and the substrate stage 14 in accordance with some embodiments. FIG. 4 is a cross-sectional view taken along the line A-A in FIG. 3.

In some embodiments, the fluid handling system 20 is configured such that the above exposure system of the lithography apparatus 10 could emit a radiation beam B (or an electron beam) with a pattern to pass through the fluid handling system 20 to expose an exposure area R1 on the substrate W. In some embodiments, the exposure area R1 is a target portion C of the substrate W that is exposed by the radiation beam B during a single static exposure or a single dynamic exposure.

In some embodiments, the fluid handling system 20 includes a fluid confinement structure 22 including an open portion 22A. In some embodiments, the open portion 22A is formed substantially at the center of the fluid confinement structure 22. In some embodiments, the open portion 22A is configured to allow an exposure area R1 on the substrate W to be exposed to an operation environment E (e.g. vacuum environment or atmospheric environment) during the exposure, such that the radiation beam B from the exposure system could pass through the open portion 22A to expose the exposure area R1. In some embodiments, the shape and/or size of the open portion 22A correspond the shape and/or size of the predetermined exposure area R1.

In some embodiments, the fluid handling system 20 is also configured to provide or dispense a heat transfer fluid 30 onto a non-exposure area R2 other than the exposure area R1 on the substrate W, such that the non-exposure area R2 on the substrate W is immersed under the heat transfer fluid 30 while the exposure system exposes the exposure area R1 with the radiation beam B, as shown in FIG. 4. In some embodiments, the fluid confinement structure 22 further includes a solid portion 22B which surrounds the open portion 22A. A heat transfer fluid 30 can be supplied into a space between the bottom surface S1 of the solid portion 22B and the substrate W during the exposure, and the solid portion 22B is configured to confine the heat transfer fluid 30 in a non-exposure area R2 other than the exposure area R1 on the substrate W (which will be further illustrated below), wherein the non-exposure area R2 surrounds the exposure area R1.

In some embodiments, the solid portion 22B is an annular structure in a circular, quadrilateral, hexagonal, or any other suitable shape. In some embodiments, the shape and size of the solid portion 22B determines the area (i.e. the non-exposure area R2) of the substrate W immersed under the heat transfer fluid 30. In some embodiments, the area of the solid portion 22B (i.e. the non-exposure area R2) is greater than the area of the open portion 22A (i.e. the exposure area R1), for example, the area of the solid portion 22B is at least twice the area of the open portion 22A.

Figure 5:
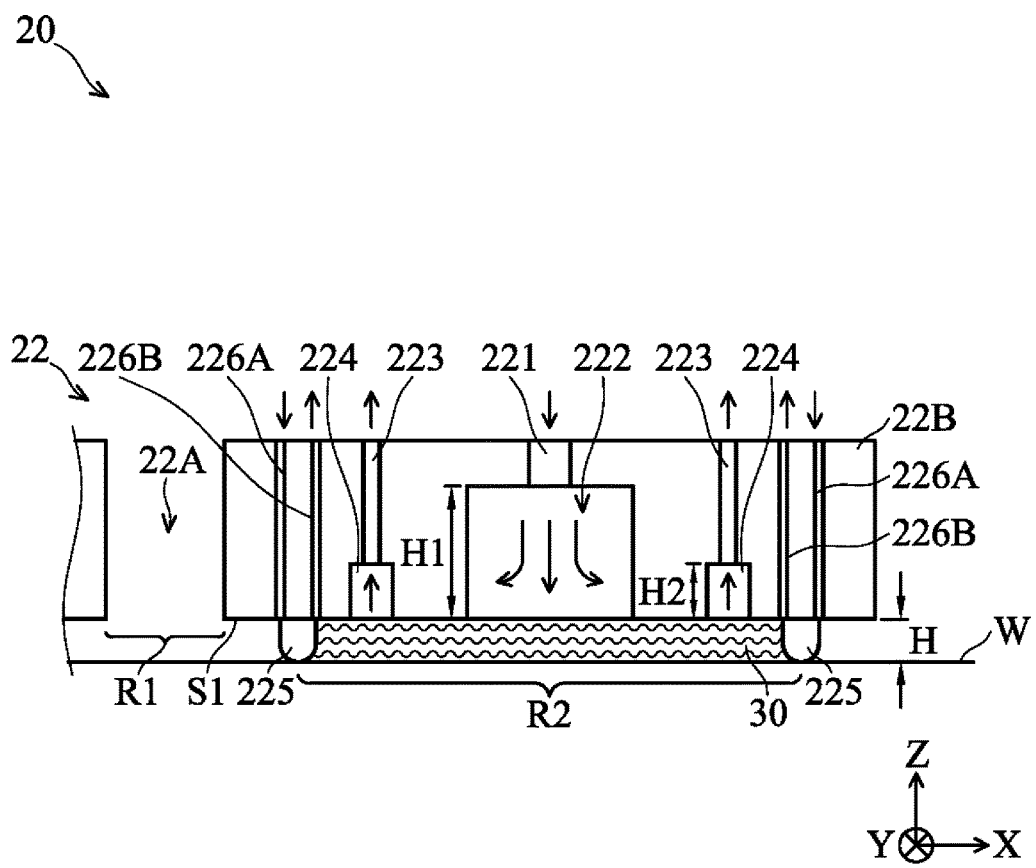
FIG. 5 schematically illustrates additional detail of the fluid handling system in accordance with some embodiments.

FIG. 5 schematically illustrates additional detail of the fluid handling system 20 in accordance with some embodiments. As shown in FIG. 5, the solid portion 22B includes at least one (first) internal channel 221 which forms a fluid inlet 222 on the bottom surface S1 of the solid portion 22B. In some embodiments, a fluid control unit (not shown) connects to the internal channel 221 and supplies the heat transfer fluid 30 into the space between the bottom surface S1 of the solid portion 22B and the substrate W via the internal channel 221 and the fluid inlet 222, e.g. during the exposure. The fluid control unit may comprise a reservoir, a pipeline, a pump, a controlling valve, a flow meter, and the like.

In some embodiments, the solid portion 22B and the fluid inlet 222 are configured such that the heat transfer fluid 30 could successfully flow into the space between the bottom surface S1 of the solid portion 22B and the substrate W in the operation of the fluid handling system 20. In some embodiments, the height H of the space between the bottom surface S1 of the solid portion 22B and the substrate W is arranged so that the heat transfer fluid 30 could successfully flow into the space. In some embodiments, the fluid inlet 222 is a recess and full with the heat transfer fluid 30 in use (but is shown empty for clarity). In some embodiments, the structure and the size (e.g. the height H1 and the width W1 (see also FIG. 6)) of the fluid inlet 222 are arranged so that the heat transfer fluid 30 could successfully flow into the space between the bottom surface S1 of the solid portion 22B and the substrate W via the fluid inlet 222.

Figure 6:
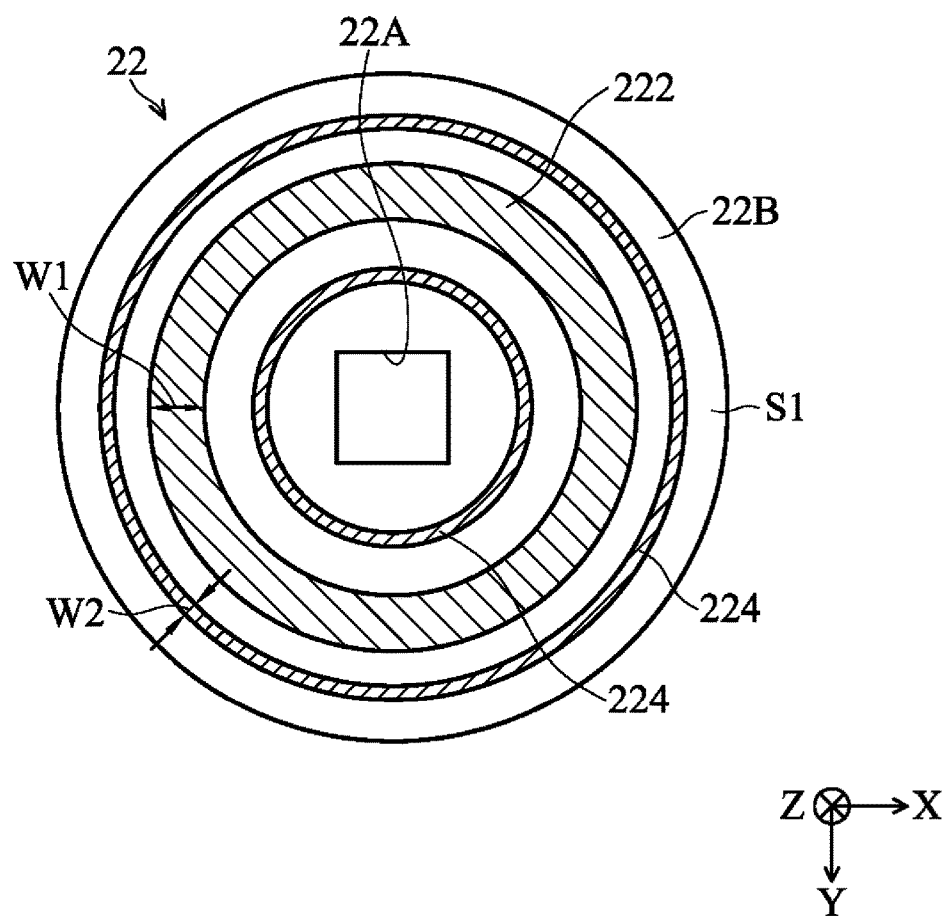
FIG. 6 schematically illustrates the arrangement of the fluid inlet and the fluid outlets formed on the bottom surface of the fluid confinement structure in accordance with some embodiments.

In some embodiments, the fluid inlet 222 is arranged as an annular (note that this term may comprise circular, quadrilateral, hexagonal, or any other suitable shape) continuous recess around the open portion 22A, as shown in FIG. 6. Alternatively, a plurality of fluid inlets 222 (e.g. discrete recesses) may be formed on the bottom surface S1 of the solid portion 22B and arranged around the open portion 22A.

In some embodiments, the solid portion 22B further includes at least one (second) internal channel 223 which forms a fluid outlet 224 on the bottom surface S1 of the solid portion 22B, as shown in FIG. 5. In some embodiments, another fluid control unit (not shown) connects to the internal channel 223 and removes/extracts the heat transfer fluid 30 from the space between the bottom surface S1 of the solid portion 22B and the substrate W via the internal channel 223 and the fluid outlet 224. In some embodiments, the removal of the heat transfer fluid 30 from the space is carried out with the supply of the heat transfer fluid 30 into the space. In some embodiments, the fluid control units connected to the internal channels 221 and 223 respectively control and adjust the pressure of their respective pump to make the heat transfer fluid 30 in a fluid flow path that is formed by the internal channel 221, fluid inlet 222, internal channel 223, fluid outlet 224, and the space between the bottom surface S1 of the solid portion 22B and the substrate W have an appropriate and desired range of flow rate. In some embodiments, the faster the flow rate of the heat transfer fluid 30 flowing through the substrate W, the more heat it can take from the substrate W. It should also be appreciated that the fluid flow can be turned off completely when the substrate W is being swapped.

In some embodiments, the solid portion 22B and the fluid outlet 224 are configured such that the heat transfer fluid 30 could successfully flow out of the space between the bottom surface S1 of the solid portion 22B and the substrate W in the operation of the fluid handling system 20. In some embodiments, the height H of the space between the bottom surface S1 of the solid portion 22B and the substrate W is arranged so that the heat transfer fluid 30 could successfully flow out of the space. In some embodiments, the fluid outlet 224 is a recess and full with the heat transfer fluid 30 in use (but is shown empty for clarity). In some embodiments, the structure and the size (e.g. the height H2 and the width W2 (see also FIG. 6)) of the fluid outlet 224 are arranged so that the heat transfer fluid 30 could successfully flow out of the space between the bottom surface S1 of the solid portion 22B and the substrate W. In some embodiments, the height H2 of the fluid outlet 224 is less than the height H1 of the fluid inlet 222, and the width W2 of the fluid outlet 224 is less than the width W1 of the fluid inlet 222.

In some embodiments, the solid portion 22B includes two fluid outlets 224 (e.g. annular continuous recesses) arranged on the inner and outer sides of the annular fluid inlet 222 (and around the open portion 22A) as shown in FIG. 6, so as to better remove the heat transfer fluid 30 from the substrate W and avoid the heat transfer fluid 30 leakage to the outside of the fluid confinement structure 22. In some embodiments, the solid portion 22B includes more than two fluid outlets 224.

In some embodiments, the heat transfer fluid 30 is also confined by several (e.g. two) seals 225 in the non-exposure area R2 between the bottom surface S1 of the solid portion 22B and the substrate W during the exposure, as shown in FIG. 5. In some embodiments, the two seals 225 are annular continuous seals formed adjacent to the inner periphery and outer periphery of the bottom surface S1, respectively. In some embodiments, the two seals 225 are gas seals each is formed by gas, such as air, synthetic air, $N_2$ or an inert gas, provided under pressure via a gas inlet channel 226A to the space between the bottom surface S1 of the solid portion 22B and the substrate W and extracted via a gas outlet channel 226B.

In some embodiments, both the gas inlet channel 226A and the gas outlet channel 226B are annular continuous channels (such as pipes, tubes, etc.) formed in the solid portion 22B and around the open portion 22A. In some embodiments, the gas outlet channel 226B is closer to the fluid inlet 222 and the fluid outlet 224 relative to the gas inlet channel 226A. In some embodiments, the overpressure on the gas inlet channel 226A, vacuum level on the gas outlet channel 226B, gap between the channels 226A and 226B, and the height H of the space between the bottom surface S1 of the solid portion 22B and the substrate W are arranged so that there is a high-velocity gas flow inwards that confines the heat transfer fluid 30 in the non-exposure area R2. In some embodiments, each gas seal 225 is also configured to remove any excess (i.e. being not extracted out of the solid portion 22B via the adjacent fluid outlet 224) heat transfer fluid 30 by a gas outflow force in the gas outlet channel 226B. In some embodiments, the fluid handling system 20 forms more than two gas seals 225 to confine the heat transfer fluid 30 between the bottom surface S1 of the solid portion 22B and the non-exposure area R2 on the substrate W.

With the above design, the heat accumulated on the substrate W during the exposure can be dissipated rapidly through conduction to the heat transfer fluid 30 above the substrate W, and then the heat transfer fluid 30 is removed from the substrate W by the fluid handling system 20. As a result, the temperature of the substrate W can be maintained within a stable, desired range during the exposure (as well as during the lithography process), thereby reducing or avoiding the CD error and/or the overlay error in the lithography process.

In some embodiments, the heat transfer fluid 30 comprises various types of material, such as gas, water, oil, mercury or the like, and the heat transfer fluid 30 is selected substantially in accordance with the operation environment E of the exposure process. In some embodiments, when the substrate W is exposed by a radiation beam B in an atmospheric environment E, a gas, such as air or inert gas, may be used as the heat transfer fluid 30 to flow through the non-exposure region R2 on the substrate W to dissipate heat. It should be appreciated that a flowing gas/air (i.e. the heat transfer fluid 30) could take more heat from the substrate W than the atmospheric air. In some embodiments, when the substrate W is exposed by a radiation beam B in an atmospheric environment E, a liquid, such as water (e.g. deionized water) or oil, may also be used as the heat transfer fluid 30 to flow through the non-exposure region R2 on the substrate W to dissipate heat, wherein the thermal conductivity of the atmospheric air is less than the thermal conductivity of the heat transfer fluid 30.

In some embodiments, when the substrate W is exposed by a radiation beam B in vacuum environment E (in this state, the substrate W will be placed in a vacuum chamber as depicted in dotted lines), a liquid, such as mercury, may be used as the heat transfer fluid 30 to flow through the non-exposure region R2 on the substrate W to dissipate heat, because that the vapor pressure of mercury is small (e.g. about 0.002 mmHg at room temperature) in a vacuum environment E. In some embodiments, when the substrate W is exposed by a radiation beam B in a vacuum environment E, a gas, such as air, may also be used as the heat transfer fluid 30 to flow through the non-exposure region R2 on the substrate W to dissipate heat, as long as the fluid handling system 20 is well designed (e.g. has the ability to remove gas flowing into the space between the bottom surface S1 of the solid portion 22B and the substrate W) and can prevent damage to the vacuum environment E due to gas leakage.

It should also be appreciated that the fluid handling system 20 (including the fluid confinement structure 22) is moved relative to the substrate W when the substrate stage 14 is shifted in the X and/or Y direction, e.g. during a scan. In some embodiments, the lithography apparatus 10 further includes an extension plate 40 disposed on the substrate stage 14 and around the substrate W (see FIGS. 3 and 4), so as to support the fluid handling system 20 and the heat transfer fluid 30 while the fluid handling system 20 is relatively moved to a position close or beyond the periphery of the substrate W. The extension plate 40 can extend the area of the substrate W and avoid leakage of the heat transfer fluid 30. In some embodiments, the thickness of the extension plate 40 is substantially the same as the thickness of the substrate W.

Figure 7:
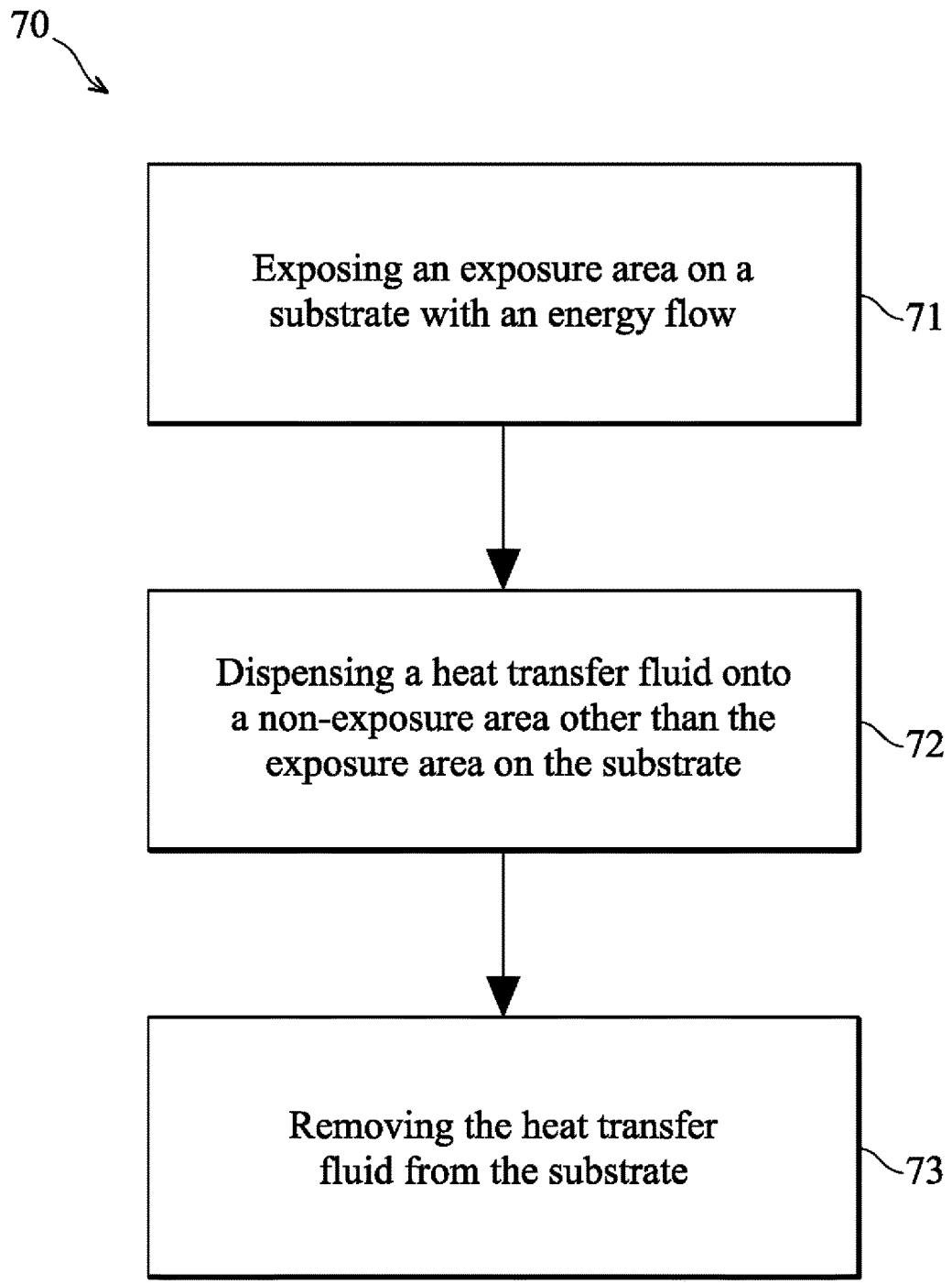
FIG. 7 is a simplified flow chart of a lithography method in accordance with some embodiments.

In the present disclosure, a lithography method is also disclosed. FIG. 7 is a simplified flow chart of a lithography method 70 in accordance with some embodiments. For illustration, the flow chart will be described along with the drawings shown in FIG. 1 to FIG. 6.

The lithography method 70 includes operation 71, in which an exposure area R1 (such as a target portion C of the substrate W that is exposed by an energy flow (such as the radiation beam B or an electron beam described above) during a single static exposure or a single dynamic exposure) on a substrate W is exposed by an energy flow projected from an exposure system of a lithography apparatus, such as the lithography apparatus 10 in FIG. 1. In some embodiments, this exposure process is carried out in atmospheric environment or in vacuum environment (e.g. for EUV imaging).

The lithography method 70 further includes operation 72, in which a heat transfer fluid 30 is dispensed, e.g. by a fluid handling system 20, onto a non-exposure area R2 other than the exposure area R1 on the substrate W. In some embodiments, the operation 71 and the operation 72 are performed simultaneously. In some embodiments, the time of exposing the exposure area R1 on the substrate W is substantially equal to or less than the time of dispensing the heat transfer fluid 30 onto the non-exposure area R2 on the substrate. In some embodiments, the heat transfer fluid 30 comprises gas or liquid.

In addition, the lithography method 70 includes operation 73, in which the heat transfer fluid 30 is removed, e.g. by the fluid handling system 20, from the substrate W. The heat transfer fluid 30 can take heat from the substrate W, so that the temperature of the substrate W is maintained within a stable, desired range during the exposure.

Some of the described stages may be replaced or eliminated in different embodiments. Alternatively, some stages or operations may be added in different embodiments. For example, in some embodiments, the lithography method 70 further includes the operation of driving the heat transfer fluid 30, e.g. by the fluid handling system 20, to flow through the non-exposure area R2 during the exposure. In some embodiments, the lithography method 70 further includes the operation of confining the heat transfer fluid 30 in the non-exposure area R2 using a gas pressure method (e.g. gas seals 225). In some embodiments, the lithography method 70 further includes the operation of exposing a plurality of exposure areas R1 on the substrate W successively, e.g. during a scan, and operation of driving the heat transfer fluid 30 to continuously flow through a plurality of non-exposure areas R2 with respect to the respective exposure area R1.

The embodiments of the present disclosure have some advantageous features: The fluid handling system 20 can keep an exposure area R1 on a work piece/substrate W exposed for exposure and provide a heat transfer fluid 30 to flow through a non-exposure area R2 other than the exposure area R1 on the substrate W at the same time. The heat transfer fluid 30 can help take heat from the substrate W, so that the temperature of the substrate W is maintained within a stable, desired range during the exposure (as well as during the lithography process). Therefore, the CD error and/or the overlay error in the lithography process can be reduced (i.e. the lithography process yield can be improved).

In some embodiments, a lithography apparatus is provided. The lithography apparatus includes an exposure system and a fluid handling system. The exposure system is configured to expose an exposure area on a substrate with an energy flow (such as a radiation beam, an electron beam, etc.). The fluid handling system is configured to provide a heat transfer fluid flowing through a non-exposure area other than the exposure area on the substrate.

In some embodiments, a lithography apparatus is provided. The lithography apparatus includes an exposure system and a fluid handling system. The exposure system is configured to expose an exposure area on the substrate with an energy flow in an operation environment. The fluid handling system is configured such that the exposure area is exposed to the operation environment and a non-exposure area other than the exposure area on the substrate is immersed under a heat transfer fluid that is provided by the fluid handling system.

In some embodiments, a lithography method is provided. The lithography method includes exposing an exposure area on a substrate with anenergy flow. The lithography method further includes dispensing a heat transfer fluid onto a non-exposure area other than the exposure area on the substrate. In addition, the lithography method includes removing the heat transfer fluid from the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A lithography apparatus, comprising:
    an exposure system configured to expose an exposure area on a substrate with an energy flow; and
    a fluid handling system configured to provide a heat transfer fluid flowing through a non-exposure area other than the exposure area on the substrate,
    wherein the fluid handling system includes a fluid confinement structure configured to confine the heat transfer fluid in the non-exposure area surrounding the exposure area, and the non-exposure area is greater than the exposure area, the fluid confinement structure comprising:
        an open portion through which the exposure area is exposed, and the energy flow passes through the open portion to expose the exposure area; and
        a solid portion surrounding the open portion and configured to confine the heat transfer fluid between a bottom surface of the solid portion and the non-exposure area,
        wherein the fluid confinement structure is configured to form two gas seals between the bottom surface and the substrate and adjacent to an inner periphery and an outer periphery of the bottom surface, respectively, to confine the heat transfer fluid in the non-exposure area and avoid leakage of the heat transfer fluid to outside of the fluid confinement structure.

2. The lithography apparatus as claimed in claim 1, wherein the fluid confinement structure further includes a first internal channel connected to a fluid inlet formed on the bottom surface of the solid portion for delivering the heat transfer fluid into the non-exposure area.

3. The lithography apparatus as claimed in claim 2, wherein the fluid confinement structure further includes a second internal channel connected to a fluid outlet formed on the bottom surface of the solid portion for removal of the heat transfer fluid from the non-exposure area.

4. The lithography apparatus as claimed in claim 3, wherein the fluid outlet is an annular continuous recess surrounding the open portion.

5. The lithography apparatus as claimed in claim 1, further comprising an extension plate disposed around the substrate and configured to support the fluid handling system and the heat transfer fluid.

6. A lithography apparatus, comprising:
an exposure system configured to expose an exposure area on a substrate with an energy flow in an operation environment; and
a fluid handling system configured such that the exposure area is exposed to the operation environment and a non-exposure area other than the exposure area on the substrate is immersed under a heat transfer fluid that is provided by the fluid handling system,
wherein the fluid handling system includes a fluid confinement structure configured to confine the heat transfer fluid in the non-exposure area surrounding the exposure area, and the non-exposure area is greater than the exposure area, the fluid confinement structure comprising:
an open portion through which the exposure area is exposed, and the energy flow passes through the open portion to expose the exposure area; and
a solid portion surrounding the open portion and configured to confine the heat transfer fluid between a bottom surface of the solid portion and the non-exposure area,
wherein the fluid confinement structure is configured to form two gas seals between the bottom surface and the substrate and adjacent to an inner periphery and an outer periphery of the bottom surface, respectively, to confine the heat transfer fluid in the non-exposure area and avoid leakage of the heat transfer fluid to the operation environment.

7. The lithography apparatus as claimed in claim 6, wherein the operation environment is a vacuum environment.

8. The lithography apparatus as claimed in claim 6, wherein the operation environment is an atmospheric environment, and the thermal conductivity of atmospheric air is less than the thermal conductivity of the heat transfer fluid.

9. The lithography apparatus as claimed in claim 6, wherein the heat transfer fluid comprises gas or liquid.

10. A lithography method, comprising:
exposing an exposure area on a substrate with an energy flow in an operation environment;
dispensing a heat transfer fluid onto a non-exposure area other than the exposure area on the substrate, wherein the non-exposure area is greater than the exposure area;
forming gas seals to confine the heat transfer fluid in the non-exposure area and avoid leakage of the heat transfer fluid to the operation environment; and
removing the heat transfer fluid from the substrate.

11. The lithography method as claimed in claim 10, wherein the steps of exposing the exposure area and dispensing the heat transfer fluid onto the non-exposure area are performed simultaneously.

12. The lithography method as claimed in claim 10, further comprising:
driving the heat transfer fluid to flow through the non-exposure area during the exposure.

13. The lithography method as claimed in claim 10, further comprising:
exposing a plurality of exposure areas on the substrate successively; and
driving the heat transfer fluid to continuously flow through a plurality of non-exposure areas with respect to the respective exposure area.

14. The lithography method as claimed in claim 10, wherein the non-exposure area is enclosed by the gas seals such that the heat transfer fluid does not flow from the non-exposure area to the exposure area.

15. The lithography apparatus as claimed in claim 2, wherein the two gas seals are formed on opposite sides of the fluid inlet.

16. The lithography apparatus as claimed in claim 3, wherein a height of the fluid outlet is less than that of the fluid inlet, and a width of the fluid outlet is less than that of the fluid inlet.

17. The lithography apparatus as claimed in claim 3, wherein the fluid inlet is located between the two gas seals, and the fluid outlet is located between the fluid inlet and one of the two gas seals.

18. The lithography apparatus as claimed in claim 17, wherein the fluid confinement structure further comprises a second fluid outlet formed on the bottom surface of the solid portion for removal of the heat transfer fluid from the non-exposure area, and the fluid outlet and the second fluid outlet are located on opposite sides of the fluid inlet.

19. The lithography apparatus as claimed in claim 1, wherein each of the two gas seals is formed by supplying a gas via a gas inlet channel formed in the solid portion to a space between the bottom surface of the solid portion and the substrate and by extracting the gas via a gas outlet channel formed in the solid portion from the space.

20. The lithography apparatus as claimed in claim 19, wherein both the gas inlet channel and the gas outlet channel are annular continuous channels surrounding the open portion.

* * * * *